United States Patent
Xu et al.

(10) Patent No.: US 10,199,400 B2
(45) Date of Patent: Feb. 5, 2019

(54) ARRAY SUBSTRATE, DISPLAY PANEL AND DISPLAY DEVICE

(71) Applicants: BOE TECHNOLOGY GROUP CO., LTD., Beijing (CN); ORDOS YUANSHENG OPTOELECTRONICS CO., LTD., Inner Mongolia Autonomous Region (CN)

(72) Inventors: Jingyi Xu, Beijing (CN); Bo Yang, Beijing (CN); Yanwei Ren, Beijing (CN); Yu Liu, Beijing (CN); Xin Zhao, Beijing (CN); Yanyan Zhao, Beijing (CN); Erpeng Zhao, Beijing (CN); Zhiqiang Wang, Beijing (CN); Wei Zhang, Beijing (CN)

(73) Assignees: BOE TECHNOLOGY GROUP CO., LTD. (CN); ORDOS YUANSHENG OPTOELECTRONICS CO., LTD. (CN)

( * ) Notice: Subject to any disclaimer, the term of this patent is extended or adjusted under 35 U.S.C. 154(b) by 0 days.

(21) Appl. No.: 15/325,264

(22) PCT Filed: Feb. 24, 2016

(86) PCT No.: PCT/CN2016/074394
§ 371 (c)(1),
(2) Date: Jan. 10, 2017

(87) PCT Pub. No.: WO2017/045367
PCT Pub. Date: Mar. 23, 2017

(65) Prior Publication Data
US 2018/0219030 A1    Aug. 2, 2018

(30) Foreign Application Priority Data
Sep. 15, 2015   (CN) .......................... 2015 1 0587769

(51) Int. Cl.
*H01L 27/14* (2006.01)
*H01L 27/12* (2006.01)
(Continued)

(52) U.S. Cl.
CPC .......... *H01L 27/1244* (2013.01); *G09G 3/20* (2013.01); *H01L 23/60* (2013.01); *H01L 27/0292* (2013.01); *H01L 27/12* (2013.01)

(58) Field of Classification Search
CPC .. H01L 27/1244; H01L 27/0292; H01L 23/60
(Continued)

(56) References Cited

U.S. PATENT DOCUMENTS 6,891,258 B1 * 5/2005 Alexander ............. H01G 4/232
257/678
8,431,832 B2 * 4/2013 Nagasawa ............. H01L 21/486
174/262
(Continued)

FOREIGN PATENT DOCUMENTS

CN    101087490 A    12/2007
CN    101231398 A    7/2008
(Continued)

OTHER PUBLICATIONS

PCT International Search Report and Written Opinion dated Jun. 27, 2016, Application No. PCT/CN2016/074394, 13 Pages.
(Continued)

*Primary Examiner* — Tan N Tran
(74) *Attorney, Agent, or Firm* — Brooks Kushman P.C.

(57) ABSTRACT

The present disclosure provides an array substrate, a display panel and a display device. The array substrate includes a first conductive pattern and a second conductive pattern forming a ground (GND) protection circuit. The first conductive pattern includes a plurality of first conductive segments spaced apart from each other, and adjacent first
(Continued)

conductive segments are connected to each other by the second conductive pattern, an insulating layer is arranged between the first conductive segments and the second conductive pattern, and the first conductive segments are connected to the second conductive pattern through via holes penetrating through the insulating layer. In addition, the present disclosure provides a display panel including the above array substrate. Furthermore, the present disclosure provides a display device including the above array substrate.

11 Claims, 5 Drawing Sheets

(51) Int. Cl.
*G09G 3/20* (2006.01)
*H01L 23/60* (2006.01)
*H01L 27/02* (2006.01)

(58) Field of Classification Search
USPC .......................................... 257/59, 72, 432
See application file for complete search history.

(56) References Cited

U.S. PATENT DOCUMENTS

| | | | |
|---|---|---|---|
| 2012/0075218 A1* | 3/2012 | Lin | ........................ G06F 3/0418 345/173 |
| 2015/0188218 A1* | 7/2015 | Elsherbini | ............ H01Q 1/2283 343/905 |

FOREIGN PATENT DOCUMENTS

| | | |
|---|---|---|
| CN | 102376723 A | 3/2012 |
| CN | 202886795 U | 4/2013 |
| CN | 103091922 A | 5/2013 |
| CN | 103296021 A | 9/2013 |
| CN | 103441119 A | 12/2013 |
| CN | 105097847 A | 11/2015 |
| CN | 204905256 U | 12/2015 |

OTHER PUBLICATIONS

First Office Action for Chinese Application No. 201510587769.2, dated Jul. 13, 2017, 9 Pages.

\* cited by examiner

ARRAY SUBSTRATE, DISPLAY PANEL AND DISPLAY DEVICE

CROSS-REFERENCE TO RELATED APPLICATION APPLICATIONS

This application is the U.S. national phase of PCT Application No. PCT/CN2016/074394 filed on Feb. 24, 2016, which claims priority to Chinese Patent Application No. 201510587769.2 filed on Sep. 15, 2015, the disclosures of which are incorporated in their entirety by reference herein.

TECHNICAL FIELD

The present disclosure relates to the field of electronics, and in particular to an array substrate, a display panel and a display device.

BACKGROUND

Damage and harms caused by Electro-Static Discharge (ESD) to electronic products are sudden or potential. In theory, a ground (GND) is arranged at an integrated circuit (IC). At the GND, the probability of damaging to a display panel caused by ESD is the smallest. However, according to the actual test result, the display panel is defective mainly at the position near to the GND. Therefore, it may be considered that although the IC side is connected to the GND, the excessive current generated by the ESD exceeds the protection capability of the GND. Therefore, it can be deduced that the greater the equivalent edge resistance is, the more easily the ESD can be conducted out by the GND protection circuit, and the less likely the display panel is defective.

There is no specific way to release the static charges formed in electronic products, so when the quantity of static charges reaches a certain extent, the electronic products may be damaged. In the related art, a grounding point is arranged on an array substrate, and the static charges in the substrate are released via a specific electrical connection. Every time the static charges are released, the components will be damaged, but the damage to the components is not irreversible, so the component may still work. However, with the continuous ESD bombardment, a permanent damage may be made to the electronic products.

SUMMARY

In view of this, the present disclosure provides an array substrate, a display panel and a display device, so as to provide a better electrostatic protection.

The array substrate provided by the present disclosure based on the above objective includes a first conductive pattern and a second conductive pattern forming a ground (GND) protection circuit, wherein the first conductive pattern comprises a plurality of first conductive segments spaced apart from each other, and adjacent first conductive segments are connected to each other by the second conductive pattern, an insulating layer is arranged between the first conductive segments and the second conductive pattern, and the first conductive segments are connected to the second conductive pattern through via holes penetrating through the insulating layer.

Optionally, the first conductive segments are formed by a transparent conductive layer.

Optionally, the second conductive pattern is formed by a source-drain metal layer or a gate metal layer.

Optionally, the second conductive pattern comprises a plurality of second conductive segments spaced apart from each other, and each of the second conductive segments is arranged in a gap between the adjacent first conductive segments.

Optionally, a width of each of the first conductive segments is different from a width of the second conductive pattern.

Optionally, the width of the second guide pattern is half the width of each of the first conductive segments.

Optionally, a length of each of the first conductive segments is larger than a length of a gap between the adjacent first conductive segments.

Optionally, the second conductive pattern is in contact with a base substrate of the array substrate or spaced apart from the base substrate.

The first conductive pattern is in contact with the insulating layer and arranged at a side of the second conductive pattern away from the base substrate.

Optionally, the length of each of the first conductive segments is twice the length of the gap between the adjacent first conductive segments.

Optionally, the insulating layer is a passivation layer.

Furthermore, the present disclosure provides a display panel including the array substrate in any one of the embodiments of the present disclosure.

Furthermore, the present disclosure provides a display device including the array substrate in any one of the embodiments of the present disclosure.

It can be seen from the above, the array substrate, the display panel and the display device provided by the present disclosure each is provided with a special conductive pattern disposed at the periphery of the array substrate, and the conductive pattern is provided with at least two layers of conductive material electrically connected to each other through a via hole. Because the resistance at the via hole where the two film layers form an electrical connection is large, the whole conductive pattern may have a relative large resistance, thereby achieving a good electrostatic protection, avoiding the ESD damage, and solving the technical issues of ESD test NG in the product reliability. With the resistance difference between film layers, the contact resistance may be increased while arranging the conductive pattern, and the resistance at the via hole is relative large, thereby solving the technical problem that it is impossible to withstand ESD due to the too small conductive resistance of the conductive pattern.

In addition, according to the array substrate provided by the embodiments of the present invention, a transparent conductive layer and a source-drain metal layer, or a transparent conductive layer and a gate metal layer, which are the film layers of the display panel itself, are used as the film layer material of the conductive pattern, therefore it is not required to arrange any additional film layer. In addition, the film layer of the conductive pattern may be formed while forming the film layers of the display panel, thereby simplifying the manufacturing process. According to the present disclosure, it is not required to add any redundant mask, to change the thickness of the film layer, or to add process steps, and the productivity may not be reduced and the ESD may be avoided. Based on an analysis of the ESD damage mechanism, a method for improving the ESD protection and a corresponding improved scheme are provided.

DETAILED DESCRIPTION

In order to make the technical issues, the technical solutions and the advantages of the present disclosure clearer, the present disclosure will be described in detail in conjunction with the drawings and embodiments.

Figure 1:
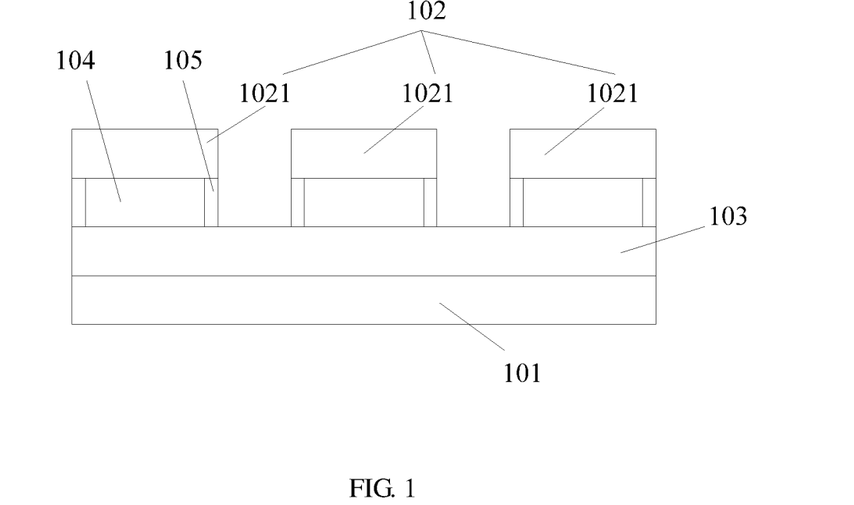
FIG. 1 is a schematic diagram of an array substrate in some embodiments of the present disclosure.

As shown in FIG. 1, an array substrate 101 is provided in the present disclosure, including a first conductive pattern 102 and a second conductive pattern 103 forming a GND protection circuit. The first conductive pattern 102 includes a plurality of first conductive segments 1021 spaced apart from each other, and adjacent first conductive segments 1021 are connected to each other by the second conductive pattern 103, an insulating layer 104 is arranged between the first conductive segments 1021 and the second conductive pattern 103, and the first conductive segments 1021 are connected to the second conductive pattern 103 through via holes 105 penetrating through the insulating layer 104.

Figure 4A:
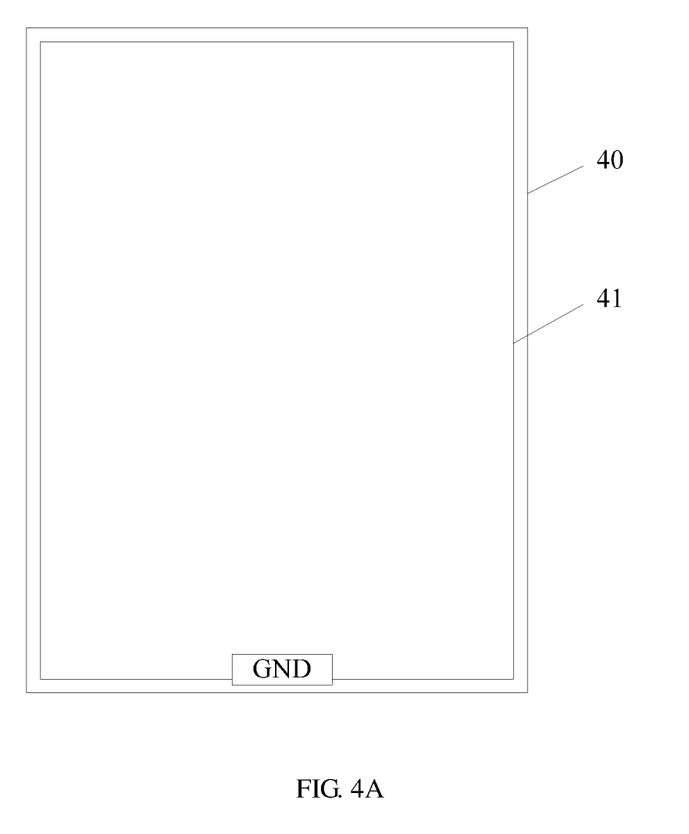
FIG. 4A is a schematic diagram of an arrangement of a conductive pattern on an array substrate in the related art.
Figure 4B:
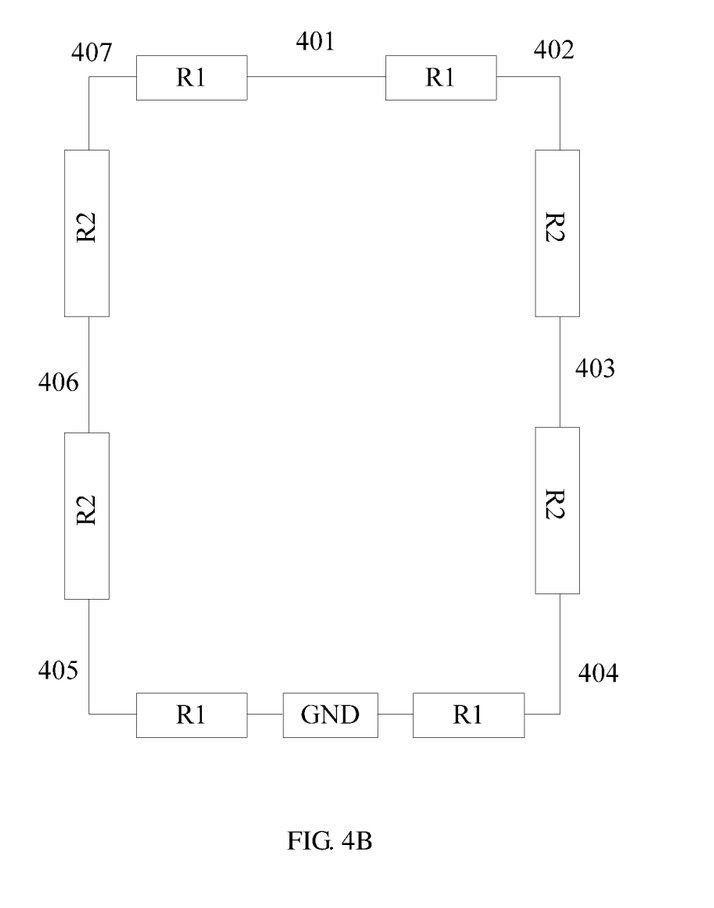
FIG. 4B is an equivalent circuit diagram of a conductive pattern in the related art.

A GND protection circuit in the related art is shown in FIG. 4A, a conductive pattern 40 is provided around the array substrate 41. Normally, a wiring of the conductive pattern is formed by a continuous gate metal layer and a continuous source-drain metal layer, and two ends of the wiring are connected to the GND. The resistance at the various positions of the GND protection circuit is the same. FIG. 4B is an equivalent circuit of the GND protection circuit in the related art. Referring to FIG. 4B, at position 401, the resistance R=(2R1+2R2)×(2R1+2R2)/2(2R1+2R2) =R1+R2=2.8R1; similarly, at position 402, the resistance R=2.7R1; the resistance at position 407 is identical to the resistance at position 402; at position 403, the resistance R=1.875R1; the resistance at position 403 is identical to the resistance at position 406; at position 404, the resistance R=0.91R1; and the resistance at position 405 is identical to the resistance at position 404.

The GND protection circuit surrounds the array substrate and forms a rectangle with an opening. The resistance R1 is half an equivalent resistance of a short side of the rectangle of the conductive pattern of FIG. 4A. The resistance R2 is an equivalent resistance of a long side of the conductive pattern of FIG. 4A, and the above resistance calculation formula is obtained with reference to the aspect ratio of 1.8:1 of the array substrate.

Still referring to FIG. 4B, theoretically, at the GND (at the position of the IC), the probability of damaging to the display panel caused by ESD is the smallest. However, according to the actual test result and the calculation result, the display panel is defective mainly at the GND, position 404 and position 405. Therefore, it can be considered that although the IC side is connected to the GND, the excessive current generated by the ESD exceeds the protection capability of the GND. Therefore, it can be deduced that the greater the equivalent edge resistance is, the more easily the ESD can be conducted out by the GND protection circuit, and the less likely the display panel is defective. Therefore, the new idea is to protect the display panel by increasing the resistance of the GND protection circuit thereof so as to improve the anti-ESD capability thereof.

The array substrate provided by the present disclosure includes two layers of conductive patterns. An insulating layer is arranged between the two layers of conductive patterns. The two layers of conductive patterns are electrically connected to each other through via holes penetrating through the insulating layer, and the resistance at the via hole is relatively large, thereby increasing the resistance of the overall GND protection circuit.

Specifically, the second conductive pattern is arranged in contact with the base substrate of the array substrate or arranged at a position near to the base substrate of the array substrate. The first conductive pattern is arranged in contact with the insulating layer and at a position further away from the base substrate of the array substrate relative to the second conductive pattern.

In some embodiments of the present disclosure, the first conductive segments are formed by a transparent conductive layer. As such, the first conductive segments may be formed by the original transparent conductive layer structure of the display panel while forming the transparent conductive layer, so there is no need to add any new layer structure, thereby increasing the circuit resistance without increasing the manufacturing difficulty.

Specifically, the transparent conductive layer is ITO (Indium Tin Oxide).

In some embodiments of the present disclosure, the second conductive pattern is formed by a source-drain metal layer or a gate metal layer. The second conductive pattern may be formed by the original source-drain metal layer or gate metal layer of the display panel, so there is no need to add any new layer structure, thereby increasing the circuit resistance without increasing the manufacturing difficulty.

Specifically, in some embodiments of the present disclosure, the second conductive pattern is formed by a source-drain metal layer.

In some embodiments of the present disclosure, the first conductive pattern is formed by an ITO layer, the second conductive pattern is formed by a source-drain metal layer, and a PVX passivation is formed between the ITO layer and the source-drain metal layer. The contact resistance between the source and drain electrodes and the drain electrode is smaller than the resistance between the ITO layer and the source-drain metal layer. On the basis of the increase of the resistance between the film layers, it is possible to increase the overall resistance of the ESD protection circuit by increasing the longitudinal resistance load by the PVX via hole, to improve the capability of consuming the charge generated by the ESD and to be conductive for improving the overall resistance of the GND protection circuit.

Figure 2:
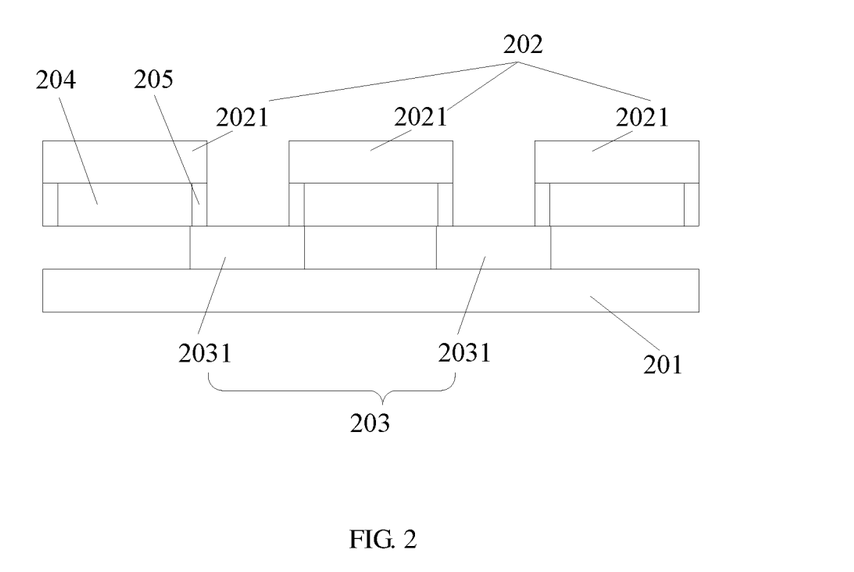
FIG. 2 is a schematic diagram of an array substrate in some embodiments of the present disclosure.

In some embodiments of the present disclosure, as shown in FIG. 2, the array substrate 201 is provided with a first conductive pattern 202 and a second conductive pattern 203. The second conductive pattern 203 includes a plurality of second conductive segments 2031 spaced apart from each other, and each of the second conductive segments 2031 is arranged in a gap between the adjacent first conductive segments 2021. An insulating layer 204 is arranged between the first conductive segments 2021 and the second conductive pattern 203, and the first conductive segments 2021 are connected to the second conductive segments 2031 through via holes 205 penetrating through the insulating layer 204.

In the embodiment shown in FIG. 1, the first conductive pattern and the second conductive pattern are equivalently to be connected in parallel. In the embodiment shown in FIG.

2, the first conductive pattern and the second conductive pattern are equivalently to be connected in series, thereby to further increase the total resistance of the GND protection circuit. Compared with the GND protection circuit in the related art, the GND protection circuit in the embodiments of the present disclosure employs a combination of a resistor series connection and a via hole connection, which increases the resistance through the series connection of resistors, and the resistance at the via hole is large, thereby further increasing the overall resistance of the GND protection circuit.

Figure 3:
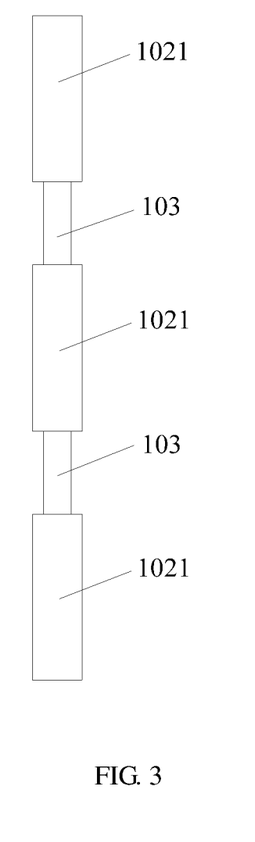
FIG. 3 is a schematic diagram of a width design of a conductive pattern in some embodiments of the present disclosure.

In some embodiments of the present disclosure, 3, with reference to the diagram of the structure of one conductive line unit of the conductive pattern as shown in FIG. 3, a width of each of the first conductive segments 1021 is different from a width of the second conductive pattern 103. The conductive pattern is formed by connecting a plurality of conductive line units as shown in FIG. 3.

In some embodiments of the present disclosure, the width of the second guide pattern is smaller than the width of each of the first conductive segments. Specifically, the width of the second conductive pattern is half the width of each of the first conductive segments.

In some embodiments of the present disclosure, a length of each of the first conductive segments is larger than a length of a gap between the adjacent first conductive segments.

In the related art, the line width of the GND protection circuit is commonly constant. In the GND protection circuit in some embodiments of the present disclosure, still with reference to FIG. 3, the width of each of the first conductive segments 1021 is twice the width of the second conductive pattern 103. The length of each of the first conductive segments 1021 is twice the length of the gap between the adjacent first conductive segments 1021. As such, it may help to provide resistances of different values at different portions of the circuit. In compared with related art where the wiring has an identical width and the resistance thereof is distributed evenly, it is able to generate a voltage drop and release static charges further.

Figure 5:
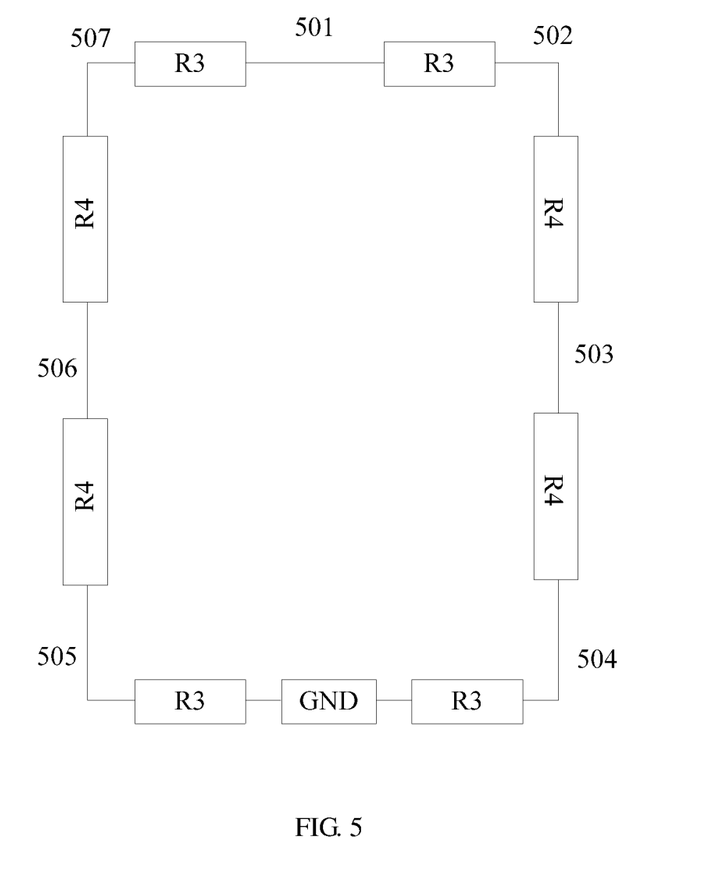
FIG. 5 is an equivalent circuit diagram in some embodiments of the present disclosure.

FIG. 5 is an equivalent circuit diagram in some embodiments of the present disclosure. As shown in FIG. 5, according to the resistivity calculation formula $R=L/S \times r$, if the width of each of the first conductive segments is twice the width of the second conductive pattern, the length of each of the first conductive segments is equal to the length of the gap between the adjacent first conductive segments, and the width of each of the first conductive segments is identical to the width of the conductive pattern in the related art, and the film thickness of each of the first conductive segments is identical to that of the conductive pattern in the related art, it can be obtained that $R3=2R1$, where $R2$ is half the equivalent resistance of the long side of the conductive pattern as shown in FIG. 3. At position 501, the resistance $R=(2R3+2R4)(2R3+2R4)/2(2R3+2R4)=R3+R4=5.6R1$. At position 502, the resistance $R=5.4R1$. The resistance at position 507 is equal to that at position 502. At position 503, the resistance $R=3.75R1$. The resistance at position 503 is equal to that at position 506. At position 504, the resistance $R=1.82R1$. The resistance at position 505 is equal to that at position 504. $R3$ is half the equivalent resistance of the short side of the conductive pattern. $R4$ is half the equivalent resistance of the long side of the conductive pattern, calculated according to the ratio of the long side to short side of the substrate of 1.8.

If the width of each of the first conductive segments is twice the width of the second conductive pattern, the length of each of the first conductive segments is twice the length of the gap between the adjacent first conductive segments, and the width of each of the first conductive segments is identical to the width of the conductive pattern in the related art, it can be obtained that $R5=4R1$. $R5$ is half the equivalent resistance of the short side of the conductive pattern, and the resistance value thereof is 4 times the initial value. With reference to the diagram of the equivalent circuit shown in FIG. 5, at position 504 and 505 where the resistance is the smallest, the resistance $R=3.64R1$.

In some embodiments of the present disclosure, the insulating layer is a PVX passivation layer.

The resistance at the via hole of the PVX passivation layer is large, thereby effectively increasing the overall resistance of the conductive pattern. At the same time, in the case that the wiring width of the conductive pattern is constant, it is able to make the resistivity at different positions in the conductive pattern to be different by arranging the PVX via hole, which is benefit for generating a pressure drop and releasing static charges.

Furthermore, the present disclosure provides a display panel including the array substrate in the embodiments hereinabove.

Furthermore, the present disclosure provides a display device including the array substrate in the embodiments hereinabove.

It can be seen from the above, the array substrate, the display panel and the display device provided by the present disclosure each is provided with a special conductive pattern disposed at the periphery of the array substrate, and the conductive pattern is provided with at least two layers of conductive material electrically connected to each other through a via hole. Because the resistance at the via hole where the two film layers form an electrical connection is large, the whole conductive pattern may have a relative large resistance, thereby achieving a good electrostatic protection, avoiding the ESD damage, and solving the technical issues of ESD test NG in the product reliability. With the resistance difference between film layers, the contact resistance may be increased while arranging the conductive pattern, and the resistance at the via hole is relative large, thereby solving the technical problem that it is impossible to withstand ESD due to the too small conductive resistance of the conductive pattern.

In addition, according to the array substrate provided by the embodiments of the present invention, a transparent conductive layer and a source-drain metal layer, or a transparent conductive layer and a gate metal layer, which are the film layers of the display panel itself, are used as the film layer material of the conductive pattern, therefore it is not required to arrange any additional film layer. In addition, the film layer of the conductive pattern may be formed while forming the film layers of the display panel, thereby simplifying the manufacturing process. According to the present disclosure, it is not required to add any redundant mask, to change the thickness of the film layer, or to add process steps, and the productivity may not be reduced and the ESD may be avoided. Based on an analysis of the ESD damage mechanism, a method for improving the ESD protection and a corresponding improved scheme are provided.

It should be understood that, the embodiments described herein are for illustrative purposes only, but shall not be used to limit the scope of the present disclosure. The embodiments of the present application and the features in the embodiments may be combined with each other without conflict.

Obviously, a person skilled in the art may make further modifications and improvements without departing from the principle of the present disclosure, and these modifications and improvements shall also fall within the scope of the present disclosure if they are within the scope of the claims and the equivalent technology.

What is claimed is:

1. An array substrate, comprising a first conductive pattern and a second conductive pattern forming a ground (GND) protection circuit, wherein the first conductive pattern comprises a plurality of first conductive segments spaced apart from each other, and adjacent first conductive segments are connected to each other by the second conductive pattern, an insulating layer is arranged between the first conductive segments and the second conductive pattern, and the first conductive segments are connected to the second conductive pattern through via holes penetrating through the insulating layer;

wherein the second conductive pattern comprises a plurality of second conductive segments spaced apart from each other, and each of the second conductive segments is arranged in a gap between the adjacent first conductive segments.

2. The array substrate according to claim 1, wherein the first conductive segments are formed by a transparent conductive layer.

3. The array substrate according to claim 1, wherein the second conductive pattern is formed by a source-drain metal layer or a gate metal layer.

4. The array substrate according to claim 1, wherein a width of each of the first conductive segments is different from a width of the second conductive pattern.

5. The array substrate according to claim 4, wherein the width of the second guide pattern is half the width of each of the first conductive segments.

6. The array substrate according to claim 1, wherein a length of each of the first conductive segments is larger than a length of a gap between the adjacent first conductive segments.

7. The array substrate according to claim 6, wherein the length of each of the first conductive segments is twice the length of the gap between the adjacent first conductive segments.

8. The array substrate according to claim 1, wherein the second conductive pattern is in contact with a base substrate of the array substrate or spaced apart from the base substrate;

the first conductive pattern is in contact with the insulating layer and arranged at a side of the second conductive pattern away from the base substrate.

9. The array substrate according to claim 1, wherein the insulating layer is a passivation layer.

10. A display panel, comprising the array substrate according to claim 1.

11. A display device, comprising the array substrate according to claim 1.

* * * * *